United States Patent
Ozawa

Patent Number: 5,898,480
Date of Patent: Apr. 27, 1999

[54] EXPOSURE METHOD

[75] Inventor: Ken Ozawa, Tokyo, Japan

[73] Assignee: Nikon Corporation, Tokyo, Japan

[21] Appl. No.: 08/772,864

[22] Filed: Dec. 26, 1996

Related U.S. Application Data

[63] Continuation of application No. 08/354,716, Dec. 6, 1994, abandoned.

[30] Foreign Application Priority Data

Dec. 8, 1993 [JP] Japan ................................ 5-307751

[51] Int. Cl.$^6$ ............................ G03B 27/42; G03B 27/54
[52] U.S. Cl. ................................................ 355/67; 355/53
[58] Field of Search ....................... 355/53, 68; 356/399, 356/400, 401; 250/201.1, 548, 559.3

[56] References Cited

U.S. PATENT DOCUMENTS

| | | | |
|---|---|---|---|
| Re. 32,795 | 12/1988 | Matsurra | 355/53 X |
| 5,097,291 | 3/1992 | Suzuki | 355/53 X |
| 5,255,051 | 10/1993 | Allen | 355/53 X |
| 5,473,410 | 12/1995 | Nishi | 355/53 R |
| 5,483,311 | 1/1996 | Sakakibara et al. | 355/53 R |

Primary Examiner—R. L. Moses
Assistant Examiner—Shival Virmani
Attorney, Agent, or Firm—Shapiro and Shapiro

[57] ABSTRACT

An exposure method wherein a mask on which a pattern is formed is illuminated with a slit-like illumination light beam, and the mask and a substrate are caused to scan the slit-like illumination light beam in a scanning direction in order to form an image of the pattern on the substrate, and wherein photo-electric signals obtained by a sensor which moves in the scanning direction, relative to the slit-like illumination light beam, and photo-electric signals obtained from the sensor which moves in a direction orthogonal to the scanning direction are integrated so as to obtain integrated values thereof, and an unevenness among the integrated values relating to a direction orthogonal to the scanning direction is calculated

61 Claims, 4 Drawing Sheets

EXPOSURE METHOD

This is a continuation of application Ser. No. 08/354,716 filed Dec. 6, 1994, now abandoned.

BACKGROUND OF THE INVENTION

1. Field of the Invention

The present invention relates to a method of measuring an unevenness in exposure, and also to an exposure method using this measuring method, which can be suitably applied for an exposure process with the use of, for example, the so-called step-and-scan type exposure apparatus or the so-called slit-scan exposure type exposure apparatus wherein a reticle and a wafer scan a slit-like illumination area in synchronization with each other so as to sequentially expose a pattern on the reticle onto shot areas on the wafer

2. Related Background Art

Heretofore, there has been used a projection exposure apparatus for a manufacture of a semiconductor element, a liquid crystal display element, a thin film magnetic head or the like with the use of a photolithographic process, in which a photomask or a reticle (which will be hereinbelow representatively denoted as "reticle") is illuminated by an illumination optical system so as to project and expose a pattern on the reticle onto a wafer (or a glass plate or the like) coated thereover with a photoresist through a projection optical system As one of characteristics for evaluating such a projection exposure apparatus, the so-called image plane unevenness in exposure caused by unevenness in transmissivity of the illumination optical system or the projection optical system has been raised. Due to this unevenness in exposure, the width of lines of a pattern exposed onto the wafer have differed from a desired value, and accordingly, it has been required to confine this unevenness in exposure within a tolerable range during the exposure.

Accordingly, it has been required to precisely measure an unevenness in exposure For example, in a conventional batch exposure type projection exposure apparatus (such as a stepper), an evenness in exposure has been measured as follows: a photo-electric conversion element (which will be hereinbelow denoted as "illumination sensor") such as a photomultiplier or a photodiode having a pin-hole like light receiving part, is set on a wafer stage on which a wafer is mounted. A photo-electric conversion element (which will be hereinbelow denoted as "integrator sensor") such as a photomultiplier or a photodiode for receiving a slight volume of light taken out from illumination light in an illumination optical system is provided in the illumination optical system The reason why the later-mentioned photo-electric conversion element is called an integrator sensor, is that the integrated exposure value over a whole exposure field on the wafer can be known from an integrated value of an output signal from the photo-electric conversion element.

Further, conventionally, the illumination sensor has been moved to several points to be measured in the exposure field defined by the projection optical system, and accordingly, output signals from the illumination sensor have been integrated over the respective actual exposure time lengths. In this case, in order to eliminate affection by a variation in light emitting energy from a light source between points to be measured, the integrated value of the output signals from the integrator sensor has been also measured, and the integrated value of the output signals from the illumination sensor 18 has been divided by the integrated value of output signals from the integrator sensor for normalization An unevenness in exposure within the exposure field has been measured from the thus obtained uneven integrated values of the output signals which have been normalized, for each of the measuring points. Further, these measuring points have been distributed in a desired area within the exposure field in order to measure an unevenness in an arbitrary area.

Recently, there has been a tendency to increase the chip size of a semiconductor element, and accordingly, large area exposure has been required for an exposure apparatus in order to expose a pattern having a larger area onto a wafer from a reticle. Further, there is a limitation on design and manufacture in order to increase the size of an exposure field defined by a projection optical system In order to increase the area of a pattern to be exposed and in order to cope with the limitation to the size of the exposure field defined by the projection optical system, the so-called step-and-scan type and slit-scan exposure type projection exposure apparatuses (which will be hereinbelow representatively denoted as "scan exposure system") in which a reticle or a wafer scans an illumination area (which will be hereinbelow denoted as "slit-like illumination area") whose shape is rectangular, arcuate, hexagonal or the like so as to sequentially expose a pattern on the reticle onto shot areas on the wafer, have been developed.

Even in such a scan-exposure type projection exposure apparatus, it is required to confine unevenness in exposure on a wafer within an allowable range after exposure by the scan exposure system, the unevenness in exposure is one of important evaluation characteristics In this regard, the scan exposure system also offers such a disadvantage in that an actual unevenness can not be measured after scan exposure only by measuring a static unevenness in exposure within an exposure field defined by a projection exposure system, as is in the case of a batch exposure system.

SUMMARY OF THE INVENTION

The present invention has been devised in view of the above-mentioned matters, and accordingly, one object of the present invention is to measure an illumination distribution of light while a sensor is moved.

Another object of the present invention is to provide a method of measuring an evenness in exposure, which can precisely measure an evenness in exposure on a wafer even after exposure by a scan exposure system with the use of a scan exposure type exposure apparatus. Further, another object of the present invention is to provide a scan exposure type exposure method using the above-mentioned measuring method.

According to the present invention, photoelectric signals are obtained from a sensor which is moved in a predetermined scanning direction, and then an unevenness among photo-electric signals (integrated values of photo-electric signals) substantially orthogonal to the scanning direction is obtained in accordance with the thus-obtained photo-electric signals.

According to one aspect of the present invention, there is provided a method comprising the steps of: obtaining photo-electric signals from a sensor while moving the latter in a predetermined scanning direction; repeating the scanning of the sensor after moving the sensor in a direction substantially orthogonal to the scanning direction, and integrating photo-electric signals obtained during each scanning; and calculating an unevenness among the thus integrated values of the photo-electric signals relating to a direction orthogonal to the scanning direction Further, according to another aspect of the present invention, there is provided an exposure apparatus comprising: an illumination optical system for illuminating a mask on which a pattern is formed, with a slit-like illumination light beam; a mask stage for moving the mask; a substrate stage for moving a substrate on which an image of the pattern is formed; a drive device for scanning the mask and the substrate relative to the slit-like illuminating light beam; a sensor provided on the substrate stage; a controller for controlling the drive device so as to move the substrate stage in a scanning direction and a direction orthogonal to the scanning direction; and a calculating device for calculating an integrated value of outputs from the sensor for each scan, and calculating an evenness among the integrated values relating the direction orthogonal to the scanning direction Further, according to another aspect of the present invention, there is provided a method of measuring an intensity of illumination, used in a manufacture of a semiconductor device, comprising the steps of:

illuminating a substrate from which the semiconductor device is formed, with a slit-like illumination light beam;

delivering a photo-electric signal from a sensor while moving the latter in the direction of the scanning, relative to the slit-like illumination light beam;

repeating the scanning of the sensor after moving the sensor in a direction orthogonal to the scanning direction;

integrating the photo-electric signals obtained during each scanning cycle; and calculating an unevenness among integrated values of the photo-electric signals relating to the direction orthogonal to the scanning direction Further, according to another aspect of the present invention, there is provided an exposure method comprising the steps of: illuminating a mask on which a pattern is formed, with a slit-like illumination light beam;

scanning said mask and a substrate so as to form an image of a pattern on the substrate;

delivering an output signal from a sensor while moving the latter in a scanning direction with respect to the slit-like illumination light beam;

using an array sensor in which a plurality of photo-electric conversion elements are arrayed in a direction orthogonal to the scanning direction, as the sensor, and integrating photo-electric signals which are obtained from the respective photo-electric elements; and calculating an unevenness among integrated values of the photo-electric signals relating to a direction orthogonal to the scanning direction

DESCRIPTION OF THE PREFERRED EMBODIMENTS

Explanation will be hereinbelow made of an embodiment of the present invention with reference to FIGS. 1 to 5. In this embodiment, the present invention is applied to an exposure process using a step-and-scan type projection exposure apparatus in which a pulsed laser is used as a light source for illumination light. It is noted that since this embodiment uses a pulsed light source, the exposure energy per each pulse which is irradiated onto a wafer will be denoted simply as "exposure dose", and the accumulated value of exposures irradiated onto a point on the wafer by plural cycles of pulsed exposure per scanning cycle will be denoted as "integrated exposure value". This integrated exposure value is the same as an exposure value obtained by using a continuously emitting light source (such as continuous wave laser or a mercury lamp) as an exposure light source.

Figure 1:
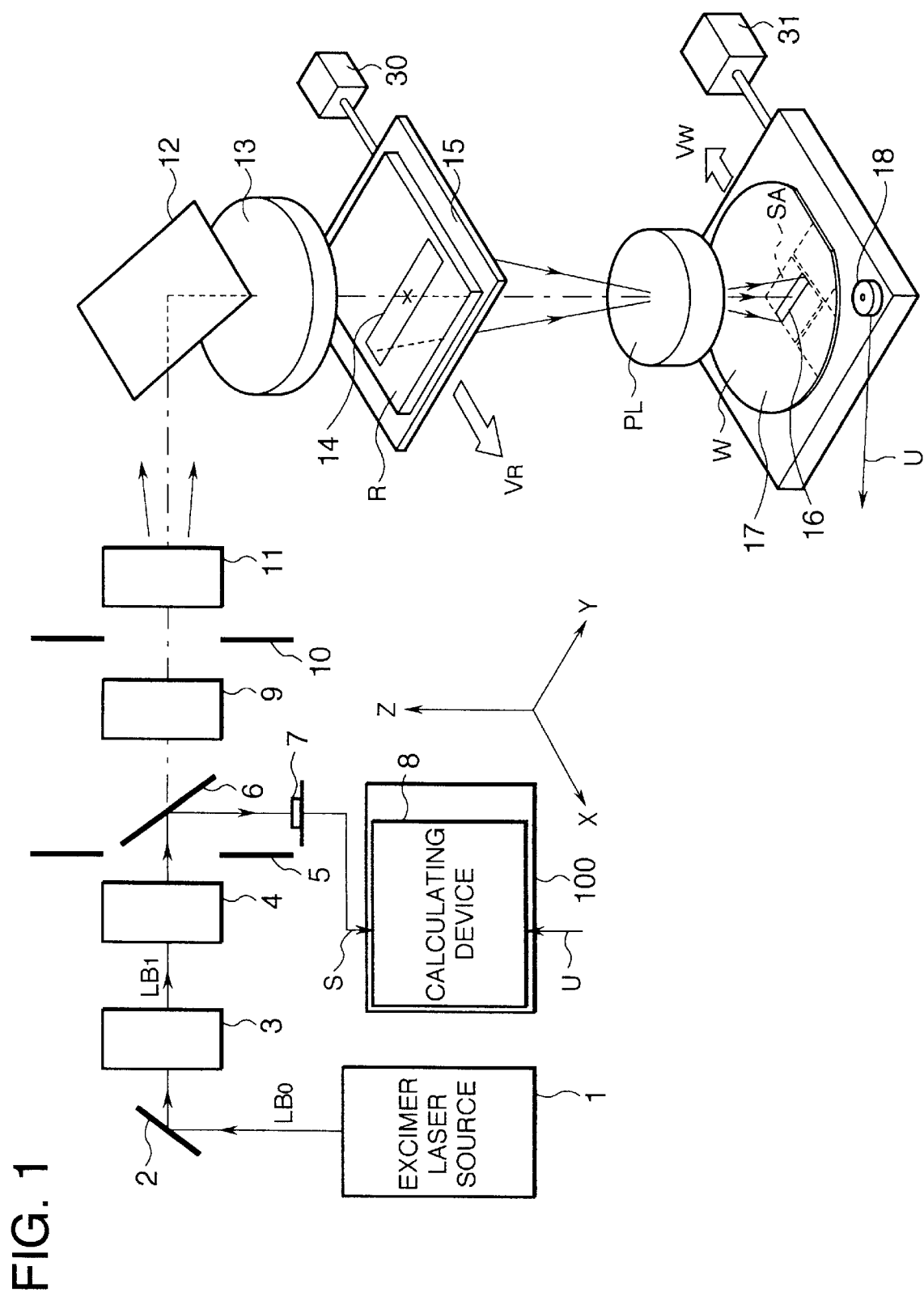
FIG. 1 is a schematic view including a perspective view in part, and illustrating a step-and-scan type projection exposure apparatus in one embodiment of the present invention.

Referring to FIG. 1 which is a schematic view illustrating a projection exposure apparatus in this embodiment, a deep UV laser beam $LB_0$ (having a wavelength of, for example, 248 nm) emitted from an excimer laser source 1 is incident upon a beam shaping optical system 3 by way of a mirror 2 so as to be shaped into a laser beam $LB_1$ having a cross-sectional shape corresponding to the shape of a fly-eye lens 4 as an optical integrator Several light source images are formed on the emission side focal plane of the fly-eye lens 4, and an aperture stop (which will be hereinbelow denoted as "σ-stop") 5 is located in the emission side focal plane Illumination light emitted from the several light source images in the aperture area of the σ-stop 5 is incident upon a beam splitter 6 for light-branching. A part of the illumination light is reflected by the beam splitter 6, and is then incident upon the light receiving surface of an integrator sensor 7 which delivers an output signal S to a calculating device 8. A proportional coefficient between the output signal from the integrator sensor 7 and an exposure energy on a wafer W has been beforehand stored in memory in the calculating device 8. Accordingly, the calculating device 8 integrates output signals S from the integrator sensor 7 in order to monitor an integrated exposure value on a wafer W. A PIN type photo diode, a photomultiplier or the like which is highly sensitive to deep-ultraviolet radiation can be used as the integrator sensor 7.

Illumination light transmitted through the beam splitter 6 illuminates a rectangular illumination area 14 on a reticle R by way of a first relay lens 9, a reticle blind 10 as a field stop, a second relay lens 11, a mirror 12 for deflecting a light path, and a main condenser lens 13. Accordingly, an image of a pattern in the illumination area 14 is projected and focused onto a rectangular exposure area 16 on the wafer W through a projection optical system PL. As shown in FIG. 1, the Z-axis is taken in parallel with the optical axis of the projection optical system, and the X-axis in the XY plane orthogonal to the optical axis is taken in the direction of the short-side of the rectangular illumination area 14.

In this case, the reticle R is held on a reticle stage 15 which causes the reticle R to scan in the X or -X direction at a predetermined speed by a motor (a step motor, a linear motor or the like) 30. Meanwhile, the wafer W is held on a wafer stage 17 which positions the wafer W in the XY plane by a motor (a step motor, a linear motor or the like) 31 and which is composed of an XY stage scanning in the X or -X direction at a predetermined speed, a Z-stage for positioning the wafer W in the Z direction, and the like. A controller 100 controls the degrees of rotation of the motors 30, 31 so as to control the relative movement between the reticle R and the wafer W.

Further, estimating that the projection magnification of the projection optical system PL is β (for example ¼), the wafer stage 17 is at first subjected to stepping drive so as to set a next shot area SA to be exposed on the wafer W at an exposure initiating position in order to carry out exposure in a scan exposure system, and thereafter, the wafer stage 17 causes the shot area SA on the wafer W to scan the exposure area 16 in the -X direction (or X direction) at a speed $V_W (V_W = \beta \cdot V_R)$ in synchronization with the scanning of the reticle R in the X-direction (or -X direction) with respect to the illumination area 14 by means of the reticle stage 15. Accordingly, an image of a circuit pattern on the reticle R is projected and exposed sequentially onto shot areas SA on the wafer W.

Further, an exposure unevenness sensor (which will be denoted as "illumination sensor") 18 composed of photoelectric conversion elements each having a pin-hole like light receiving part is located in the vicinity of the wafer W on the wafer stage 17. A PIN type photodiode, a photomultiplier or the like which is highly sensitive to deep-ultraviolet radiation, can be used as the illumination sensor 18, and an output from the illumination sensor 18 is delivered to the calculating device 8 in the controller 100. The calculating device 8 obtains a distribution of integrated exposure values and an evenness on the wafer W after exposure by the scan exposure system as explained below.

Accordingly, referring to FIGS. 2A and 2B, explanation will be made of the method, in this embodiment, of measuring an evenness among integrated exposure values, which possibly occurs in each shot-area on the wafer, during exposure by the scan exposure system. When carrying out this measurement, the reticle R is removed from the reticle stage 15 in FIG. 1. Alternatively, a plane glass pane having no pattern is set on the reticle stage 15. In this embodiment, no measurement in which a test print is used so as to handle a photoresist as a two-dimensional sensor is carried out. Should the test print be used so that an integrated exposure value on the wafer coated thereover with the photoresist and set on the wafer stage 17 is measured after scanning of the wafer W, with respect to the exposure area 16, only data containing an evenness in the coating of the photoresist, an evenness in sensitivity and the like would be obtained, and accordingly, it is difficult to carry out precise measurement.

In this embodiment, the illumination sensor 18 on the wafer stage 17 shown in FIG. 1 scans the slit-like exposure area 16 so as to measure an integrated exposure value in each shot area on the wafer W. Actually, when the exposure is made by the scan exposure system, a factor causing an evenness in the integrated exposure value which possibly occurs in the entire surface of the shot area, differs from an evenness in transmissivity of an optical system in the case of a conventional exposure type in which the measurement is made in a static condition.

Figure 2A:
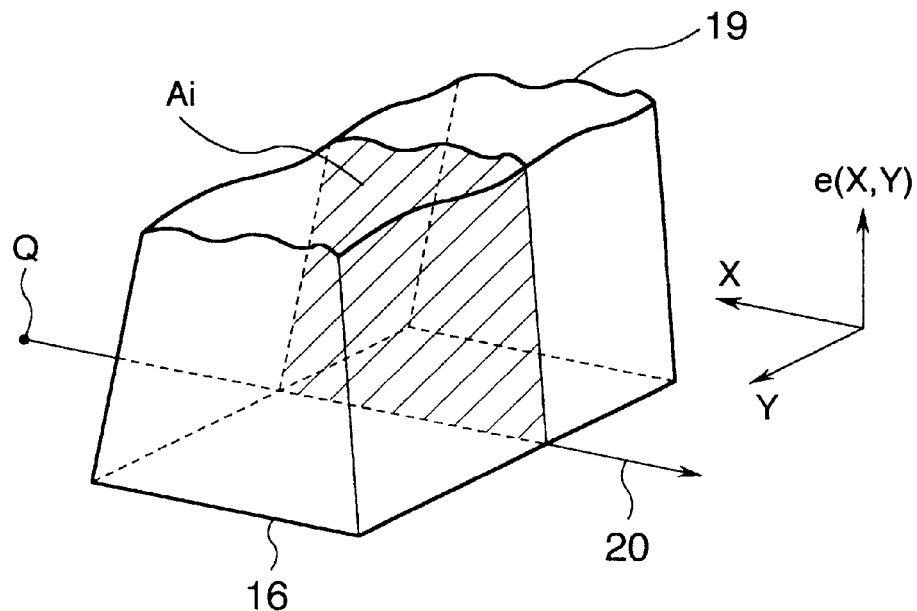
FIG. 2A is a view showing an evenness in illumination intensity in a slit-like exposure area 16 in a static condition.
Figure 2B:
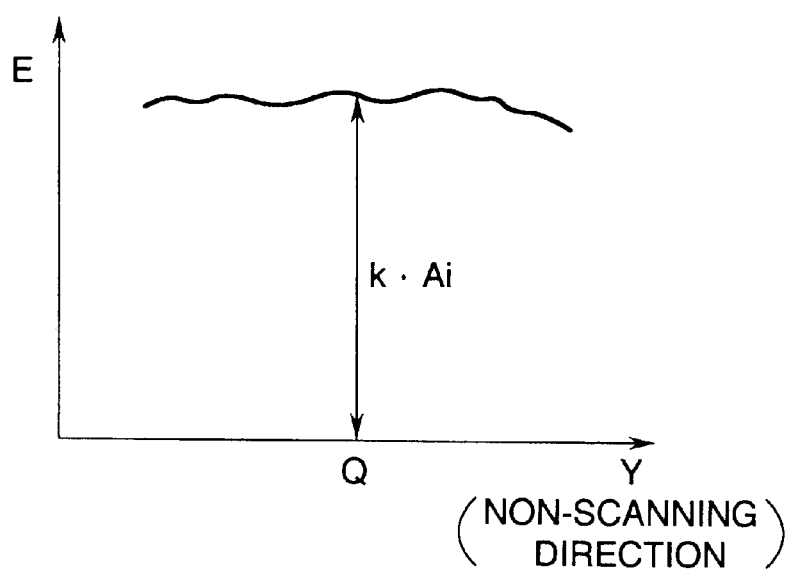
FIG. 2B is a view showing a distribution of integrated exposure values in a nonscanning direction after scanning exposure.

Referring to FIG. 2A, which shows a curve 19 of illumination distribution in the slit-like illumination exposure area 16, the curve 19 of illumination distribution exhibits a distribution e(X, Y) caused by an evenness in the transmissivity of the illumination optical system and the projection optical system PL. The distribution e (X, Y) gives an intensity of illumination at a coordinate (X, Y) position. In the case of a conventional exposure system, the distribution of exposure on the wafer W could be simply obtained only by measuring the distribution e(X, Y). However, in the case of the scan exposure system, the integrated exposure value $E_i$ at a point Q in FIG. 2A, is obtained by integrating the intensity of illumination over the exposure area 16 along a straight line 20 which passes through the point Q and which is in parallel with the scanning direction (X direction).

That is, a value $k \cdot A_i$ where $A_i$ is a cross-sectional area of the curve 19 of illumination distribution in a plane through which the straight line 20 passes, and k is a predetermined proportional coefficient, gives an integrated exposure value $E_i$ at the point Q. FIG. 2B shows the result of the measurement of the integrated exposure value $E_i$ in the Y direction (nonscanning direction). It is noted that the result of integrating the values on the curve 19 of illumination distribution at sampled points arranged along the straight line 20 is used, instead of the cross-sectional area $A_i$ since the pulsed emission is used in this embodiment.

These sample points vary in dependence upon an unevenness in the scanning speed of the wafer stage 17, an evenness in the emission timing of the pulsed laser beam source or the like. Further, the relative value of the curve 19 of illumination distribution shown in FIG. 2A, varies also in dependence upon an evenness in emission energy at every pulsed illumination of the pulsed laser source. That is, the main factor of the unevenness in the integrated exposure value E at points on the wafer W is an unevenness in the distribution of illumination in the slit-like exposure area 16, and further, an unevenness in emission energy at even pulsed emission of the pulse laser source, an error in the displacement of the wafer stage 17 during pulsed emission (an unevenness in speed), a jitter of the emission timing also possibly become factors of the unevenness in the integrated exposure value E in the scanning direction on the wafer W. Further, during the control of the exposure value, the scanning speed of the wafer stage 17 is determined with the use of the width (the so-called slit width) as one of terms, and accordingly, an error in measuring the slit width also causes an unevenness in the integrated exposure value in the scanning direction. In addition, factors caused steady-stately, or factors caused randomly (probabilistic factors) are considered to be so.

There are various factors causing such an unevenness in the integrated exposure value in each shot area on the wafer W, and accordingly, it is difficult to obtain an unevenness in the integrated exposure value for every individual factor. In this embodiment, as shown in FIG. 1, the wafer stage 17 is driven so as to cause the illumination sensor 18 to repeatedly scan the slit-like exposure area 16 in the scanning direction (X direction) in order to measure an actual integrated exposure value.

It is noted that a minimum number $N_{min}$ of exposure pulses to be irradiated onto each of points on the wafer W has been regulated in order to give a predetermined reproducibility for the integrated exposure given to each of the points on the wafer W in such a case that a pulsed laser source having a predetermined unevenness in energy at every pulsed emission, is generally used as the light source. This minimum number $N_{min}$ of exposure pulses is determined in dependence upon the degree of an unevenness in energy in each pulsed emission of the pulsed laser source. Further, when each of the points on the wafer W is irradiated with the minimum number $N_{min}$ of emission pulses, an unevenness in the integrated exposure values becomes largest. Accordingly, in order to carry out the measurement in such a condition that the evenness in the integrated exposure value becomes largest, the measurement is carried out in such a condition that each of the points on the wafer W is exposed by the minimum number $N_{min}$ of exposure pulses, that is, the measurement is carried out by causing the wafer stage 17 to scan at a maximum speed during the exposure (a maximum speed be used to expose). As mentioned above, the function of the device is thus checked. Further, it goes without saying that by similarly carrying out a measurement at an arbitrarily set exposure speed (scanning speed), an unevenness (value) in exposure at the associated set exposure value (scanning speed) can be measured.

More specifically, since the illumination light is pulsed laser, the exposure value on the substrate W, is an energy obtained by integrating exposure energies each obtained at every pulsed emission within an exposure area corresponding to the illumination area 14. In general, an unevenness in emission energy at every pulsed emission is present at the pulsed light source. An averaged pulse exposure energy on the substrate W at every pulsed light is set to p, and a range of unevennesses in the pulse exposure energy of the pulsed light is set to δp.

Further, it is estimated that the parameter δp/p which gives an unevenness in the pulsed exposure energy is normally (randomly) distributed, if the number of light pulses irradiated onto each of the points on the substrate W is set to N, the component $\Delta E_{th}$ of an unevenness in the exposure, among theoretical unevennesses in the integrated exposure value after completion of the exposure, is given by $(\delta p/p)/N^{1/2}$. Accordingly, the worst value $\Delta E_{max}$ and the theoretical unevenness $\Delta E_{th}$ has the following relationship Further, the value of $\Delta E_{th}$ is beforehand regulated in general in order to advantageously cope with occurrence of an hindrance.

$$\Delta E_{max} \geq (\Delta E_{th}^2 + \Delta E_{ot}^2)^{1/2} \qquad \text{EX1}$$

where $\Delta E_{ot}$ is a component of an unevenness in exposure caused by scan exposure (including an unevenness in the intensity of illumination in the scanning direction in a static condition, an emission jitter, an evenness in the speed of the stage, and the like)

In the above-mentioned expression, $\Delta E_{max}$ is known from the measurement according to the present invention, and $\Delta E_{th} = (\delta p/p)/N^{1/2}$ can be obtained from, for example, an unevenness in the integrated energy distribution (three times standard deviation) which can be obtained at relative scanning by branching and receiving the pulsed illumination light. It is noted that although the expression EX1 is given the sum of squares, the more severe condition, that is, $\Delta E_{max} \geq (\Delta E_{th} + \Delta E_{ot})$ can be used. With the use of the expression EX1, the maximum value of $\Delta E_{ot}$ can be given as follows:

$$\Delta E_{ot} = (\Delta E_{max}^2 - \Delta E_{th}^2)^{1/2} \qquad \text{EX2}$$

With the use of $\Delta E_{ot}$ in the expression EX2, if an allowable value (desired given value) of an unevenness in exposure in the case of the exposure by the scan exposure system at each of the points on the substrate W, is newly set to $\Delta E_{max}'$, the following relationship can be given:

$$(\delta p/p)/N^{1/2} = \Delta E_{th}^{1/2} \leq (\Delta E_{max}'^2 - \Delta E_{ot}^2)^{1/2} \qquad \text{EX3}$$

Accordingly, the minimum Number $N_{min}$ of exposure pulses is a minimum integer which can satisfy the following expression:

$$N_{min} = N \geq (\delta p/p)^2/(\Delta E_{max}'^2 - \Delta E_{ot}^2) \qquad \text{EX4}$$

Figure 3:
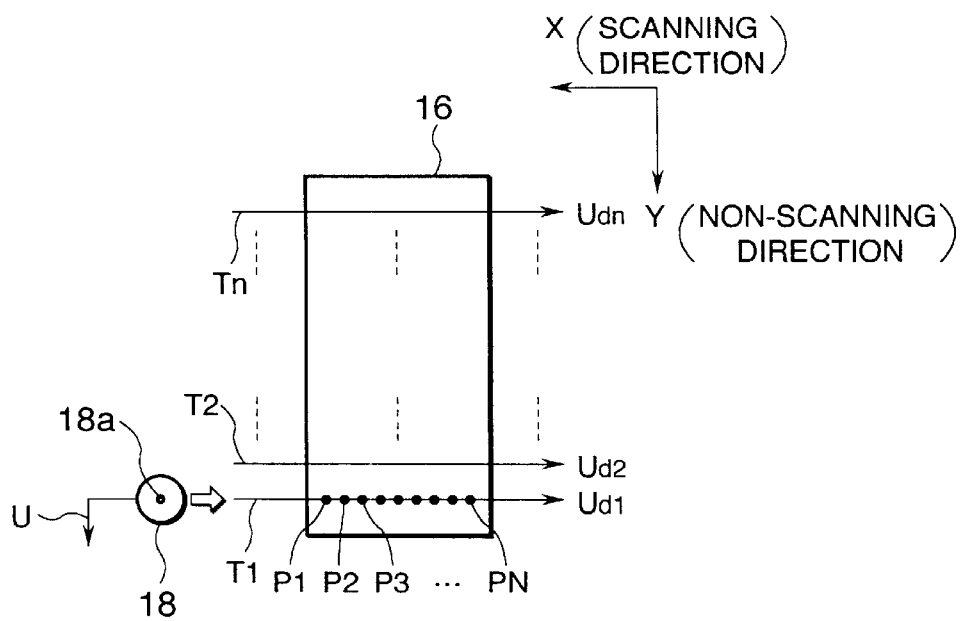
FIG. 3 is an explanatory view in the case of repetitions of scanning of an illumination sensor 18 with respect to the slit-like exposure area 16.

Referring to FIG. 3 which shows an scanning condition of the illumination sensor 18 in the case of the measurement of an unevenness in the integrated exposure value in this embodiment, the pin-hole-like light receiving area 18a of the illumination sensor 18 sequentially scan the slit-like exposure area 16 along a plurality of loci T1 to Tn (n is an integer more than 2) which are parallel with the scanning direction or the X direction. The loci T1 to Tn are arranged at substantially equal intervals in a nonscanning direction that is, a direction orthogonal to the exposure area, and accordingly the coordinate value $Y_i$ in the Y-coordinate of each locus Ti (i=1 to n) has been measured. In this phase, the wafer stage 17 scans at the maximum speed during the exposure, and accordingly, pulsed light is irradiated onto the light receiving area 18a by a cycle number $N_{min}$ which is equal to the minimum number of exposure light pulses. That is, when pulsed exposure is carried out at points P1, P2, . . . PN (N is an integer larger than 2) in a range within, for example, the width of the exposure area 16 on the locus Ti, the number N is equal to $N_{min}$. Further, during the scanning of the light receiving area 18a on each locus Ti (i=1 to n), the calculating device 8 shown in FIG. 1 integrates signals U delivered from the illumination sensor 18 in the number $N_{min}$ which is the number of light pulses, at every pulsed exposure, so as to obtain an integrated $U_{di}$.

Figure 4:
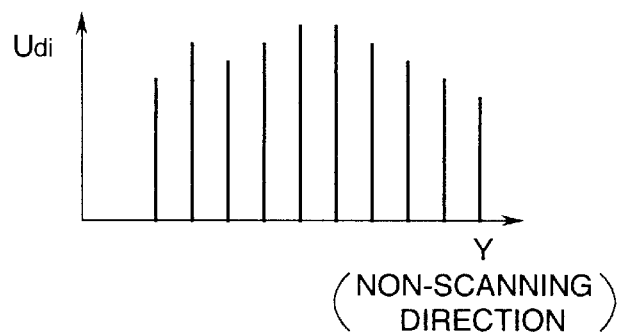
FIG. 4 is a view showing integrated output signals from the illumination sensor 18, which are obtained during measuring shown in FIG. 3, and which are lined up in a nonscanning direction.

FIG. 4 shows an array in which the thus integrated output signals $U_{di}$ are arranged, corresponding to $Y_i$ in the Y-coordinate system, an unevenness among the integrated output signals $U_{di}$ shown in FIG. 4, exhibits an unevenness which possibly occurs over the entire surface of each shot area on the wafer in the case of the exposure by the scan exposure system, that is, an unevenness in the possibly occurring worst integrated exposure value. It is noted that those which can correspond to an actual distribution are obtained by normalizing the integrated output signals $U_{di}$ with the output signals from the integrator sensor 7, and accordingly, the distribution of the integrated exposure values shown in FIG. 4 does not precisely correspond to the distribution of actual integrated exposure values in the nonscanning direction. Further, also in FIG. 5, although the component due to an unevenness in speed, an emission jitter or the like is not normalized so that it does not precisely coincide with the distribution of unevennesses in exposure, a satisfactorily approximated solution can be given.

It is noted that although the minimum number $N_{min}$ of exposure pulses is previously set in the above-mentioned embodiment, the minimum number $N_{min}$ of exposure pulses may be determined from the result of the measurement of an unevenness in the integrated exposure value by carrying out the measurement shown in FIG. 3. That is, an unevenness among the integrated output signals $U_{di}$ is set to $\Delta E_{max}$, and the number of exposure pulses irradiated onto the illumination sensor 18 during the measurement, is set to N. Further, an evenness $\Delta E_{th}$ in exposure caused by an evenness in pulse energy can be obtained from an unevenness among integrated output signals Si obtained from the integrator sensor 17 at every scan along each locus Ti, and accordingly, the component $\Delta E_{ot}$ of the unevenness in exposure caused by scan exposure can be exhibited as follows:

$$\Delta E_{ot} = (\Delta E_{max}^2 - \Delta E_{th}^2)^{1/2} \qquad \text{EX5}$$

Further, if an allowable unevenness among the integrated exposure values in the nonscanning direction is set to $\Delta E_{max}'$, since $\Delta E_{th} = (\delta p/p)/N^{1/2}$ can be given, the minimum number $N_{min}$ of exposure pulses can be determined by an integer which satisfies the following expression, corresponding to the expression EX4:

$$N_{min} \geq N \cdot \Delta E_{th}^2/(\Delta E_{max}'^2 - \Delta E_{ot}^2)$$ EX6

In this case, if the minimum number $N_{min}$ of exposure pulses is greater than the integer N, the scanning speed of the wafer stage 17 is decreased or the emission period of the excimer laser source 1 is shortened so as to satisfy the above-mentioned expression EX6. Further, if the minimum number $N_{min}$ of exposure pulses is smaller than the integer N, the integer number N is used as the minimum number $N_{min}$ of exposure pulses.

Next, explanation will be made of a method of precisely measuring a distribution of integrated exposure values in the nonscanning direction. Also in this case, as shown in FIG. 3, the light receiving area 18a of the illumination sensor 18 scans the slit-like exposure area 16, successively along a plurality of loci T1 to Tn which are parallel with the X direction or the scanning direction, and output signals $U_i$ which are delivered from the illumination sensor 18, corresponding to the number $N_{min}$ of exposure pulses at every scanning cycle, are integrated by the calculating device 8 shown in FIG. 1 so as to obtain the integrated output signal $U_{di}$. Further, simultaneously with the scanning operation of the illumination sensor 18 along each of the loci Ti (i=1 to n), output signals S from the integrator sensor 7 shown in FIG. 1 are integrated by the calculating device 8 by a number corresponding to the number $N_{min}$ of exposure pulses so as to obtain an integrated output signal $S_i$. Then, the integrated output signal $U_{di}$ from the illumination sensor 18 is normalized by dividing the integrated output signal $U_{di}$ from the illumination sensor 18, with the integrated output signal $S_i$ of the integrator sensor 7.

Figure 5:
FIG. 5 is a view showing signals which are normalized by dividing the integrated output signals from the illumination sensor 18 with integrated output signals from an integrator sensor 7, and which are lined up in a nonscanning direction.

FIG. 5 shows an array in which the thus normalized integrated output signals $U_{di}/S_i$ from the illumination sensor 18 are lined up in the nonscanning direction, corresponding to $Y_i$ of each locus Ti in the Y coordinate system. The affection caused by an unevenness in the reproducibility of emission energy from the excimer laser source 1 during the scanning of the illumination sensor 18 along each locus Ti is removed from the result shown in FIG. 5. However, the data of the normalized integrated output signals $U_{di}/S_i$ include an affection by an unevenness in the speed of the wafer stage 17, and an affection by the reproducibility of a jitter of the pulse emission timing of the excimer laser source 1. It is noted that the affection by an unevenness in the speed and the affection by the reproducibility of a jitter of the pulse emitting timing of the excimer laser source 1 are less in general unless the control conditions of the wafer stage 17 and the excimer laser source 1 become worse than those in the normal condition. Accordingly, an unevenness (which is the standard deviation σ or three times as large as this value) among the normalized integrated output signals $U_{di}/S_i$ in the nonscanning direction, as shown in FIG. 5, can be regarded as an unevenness in the integrated exposure value in the nonscanning direction, which occurs in each shot area on the wafer W in the case of actual exposure by the scan exposure system onto the wafer W coated thereover with photoresist.

Thus, according to this embodiment, with the repetitions of the scanning of the illumination sensor 18 over the slit-like exposure area 16, and only by normalizing the integrated output signal from the sensor 18 with the integrated output signal from an integrator sensor 7, it is possible to precisely measure an unevenness among the integrated exposure values on the wafer W in the nonscanning direction.

Next, explanation will be hereinbelow made of another embodiment of the present invention with reference to FIG. 6. A projection exposure apparatus used in the embodiment is substantially similar to that shown in FIG. 1, except that a line sensor including charge-storage type photo-electric conversion elements (illumination sensor 21) is used, as shown in FIG. 6, instead of the illumination sensor 18.

Figure 6:
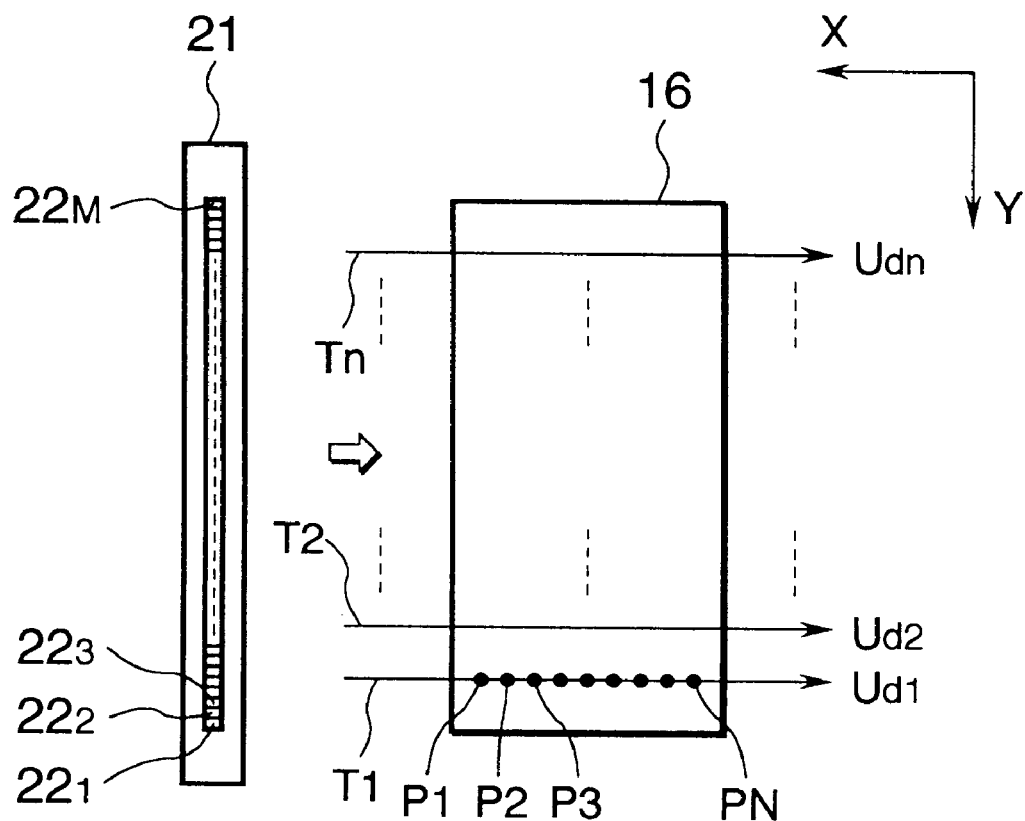
FIG. 6 is an explanatory view in the case of causing a line-sensor type illumination sensor 21 to scan once the slit-like exposure area 16.

Referring to FIG. 6 which shows an illumination sensor 21 used in this embodiment, the illumination sensor 21 is composed of a one-dimensional charge-coupling type image pick-up device (CCD) having a sensitivity to deep-ultraviolet radiation, and having light receiving pixels $22_1$ to $22_M$ (M is an integer greater than n) which are lined up in the Y direction or the nonscanning direction. In this embodiment, in order to measure an unevenness among the integrated exposure values on the wafer W, the illumination sensor 21 scans the slit-like exposure area 16, once in the X direction (or -X direction) at a maximum speed during exposure, and accumulated signals are read out from a series of the light receiving pixels in the illumination sensor 21 after the scanning.

In this case, those of the pixels in the illumination sensor 21 which cross the exposure area 16 along loci T1 to Tn which are substantially the same as the loci T1 to Tn shown in FIG. 3 are present, and accumulated signals read from light receiving pixels which have passed through a locus nearest to the locus Ti (i=1 to n), after the scanning, are denoted as $U_{di}$. In this phase, pulse exposure can be made at points P1 to PN (N is equal to the minimum number $N_{min}$ of exposure pulses) on, for example, the locus T1. However, since the illumination sensor 21 is not subjected to scanning as a one unit body, pulse exposure is carried out simultaneously for other loci T2 to Tn. Accordingly, the distributions of the accumulated signals $U_{di}$ in the nonscanning direction, which are obtained corresponding to the loci Ti shown in FIG. 6, commonly include an unevenness in the speed of the wafer stage 17, and an affection by the reproducibility of a jitter of the emission timing of the excimer laser source 1.

Thus, the distributions of the accumulated signals $U_{di}$ obtained from FIG. 6, are coincident with an unevenness among the integrated exposure values in the nonscanning direction which are obtained through the actual exposure by the scan exposure system onto the wafer W coated thereover with photoresist. Further, since the measurement can be completed only the one-time scanning of the illumination sensor 21, thereby it is possible to shorten the time of measurement. It is noted that an unevenness among the sensitivities of the light receiving pixels in the illumination sensor 21 which is of a line sensor type should be compensated to a sufficiently small value with respect to a value to be measured.

Although the above-mentioned embodiments use a pulse light source, the present invention can also be applied directly to a scan type exposure apparatus using a continuous light source such as a mercury lamp, as the exposure apparatus.

Thus, the present invention should not be limited to the above-mentioned embodiments, but can take various arrangements without departure from the general concept of the present invention.

In view of the above-mentioned exposure unevenness measuring method, since the integrated values of output signals from measuring photo-electric conversion means which has actually scanned, are directly used as they are, it is advantageous to measure a maximum value of unevenness which occur on the substrate in the case of the exposure by the scan exposure system.

Further, in the case of the normalization by dividing the integrated value of output signals from the measuring photoelectric conversion means with the integrated value of output signals from reference photo-electric conversion means, it is possible to measure an unevenness in exposure which occurs on the substrate during the exposure by the scan exposure apparatus in the nonscanning direction.

Further, an unevenness in exposure which occurs on the substrate in the case of the exposure by the scan exposure system in the nonscanning direction can be measured at a high speed only by one-time scanning of the line sensor type measuring photo-electric means.

Further, with the use of an unevenness measured by the method of measuring an unevenness in exposure, the minimum number of exposure pulses for confining unevennesses in exposure within an allowable range can be determined.

What is claimed is:

1. An exposure method comprising the steps of:
   providing a slit-like illumination light beam for illuminating a mask on which a pattern is formed so as to form an image of said pattern on a substrate by scanning said mask and said substrate in a scanning direction;
   performing a scanning operation with a sensor in which photo-electric signals are obtained from said sensor while moving said sensor in said scanning direction and relative to said slit-like illumination light beam;
   repeating the scanning operation with said sensor after moving said sensor in a direction orthogonal to said scanning direction;
   integrating said photo-electric signals obtained from said sensor for each respective scanning operation; and
   calculating an unevenness among integrated values of said photo-electric signals relating to a direction orthogonal to said scanning direction.

2. A method according to claim 1, wherein said sensor moves at a maximum speed during the scanning operations.

3. A method according to claim 1, wherein said illumination light beam has a trapezoidal distribution of illumination on said substrate with respect to said scanning direction.

4. A method according to claim 1, wherein a value related to at least one photo-electric signal from said sensor is divided by a value related to at least one output signal from a monitoring sensors, which receives light split from said illumination light beam, so as to obtain a normalized integrated value for each scanning operation.

5. A method according to claim 1, wherein said illumination light beam is in the form of exposure pulses, and photo-electric signals which are delivered from said sensor during emission of a minimum number of said exposure pulses are integrated.

6. An exposure apparatus comprising:
   an illumination optical system for illuminating a mask on which a pattern is formed, with a slit-like illumination light beam;
   a mask stage for moving said mask;
   a substrate stage for moving a substrate on which an image of said pattern is formed;
   a drive device for scanning said mask and said substrate relative to said slit-like illuminating light beam;
   a sensor provided on said substrate stage;
   a controller for controlling said drive device so as to move said substrate stage in a scanning direction, so that said sensor can perform a scanning operation, and in a direction orthogonal to said scanning directions, to position said sensor for another scanning operation; and
   a calculating device for calculating an integrated value of output signals from said sensor for each respective scanning operation and for calculating an unevenness among the integrated values relating to said direction orthogonal to said scanning direction.

7. A method of measuring an intensity of illumination, used in a manufacture of a semiconductor device, comprising the steps of:
   providing a slit-like illumination light beam for illuminating a substrate from which said semiconductor device is formed;
   performing a scanning operation with a sensor in which photo-electric signals are obtained from said sensor while moving said sensor in a scanning direction and relative to said slit-like illumination light beam;
   repeating said scanning operation with said sensor after moving said sensor in a direction orthogonal to said scanning direction;
   integrating said photo-electric signals obtained from said sensor during each respective scanning operation; and
   calculating an unevenness among integrated values of said photo-electric signals relating to the direction orthogonal to the scanning direction.

8. An exposure method comprising the steps of:
   providing a slit-like illumination light beam for illuminating a mask on which a pattern is formed so as to form an image of said pattern on a substrate by scanning said mask and said substrate;
   performing a scanning operation with an array sensor having a plurality of photo-electric conversion elements arrayed in a direction orthogonal to the scanning directions, in which output signals are obtained from said plurality of photo-electric conversion elements while moving said array sensor in a scanning direction with respect to the slit-like illumination light beam;
   integrating photo-electric signals which are obtained from said photo-electric conversion elements, respectively; and
   calculating an unevenness among integrated values of said photo-electric signals relating to a direction orthogonal to said scanning direction.

9. A method according to claim 1, wherein said sensor scans at a predetermined speed relating to said scanning direction during the scanning operation.

10. An exposure apparatus comprising:
    a mask stage for carrying a mask on which a pattern is formed;
    an illumination optical system for illuminating the mask with a slit-like illumination light beam;
    a substrate stage carrying a substrate on which an image of said pattern is formed;
    a drive device to scan said mask and said substrate relative to said slit-like illumination light beam;
    a sensor provided on said substrate stage and having a plurality of light receiving elements which are arranged thereon in a direction across a scanning direction;
    a control system to control said drive device so as to move said sensor in said scanning direction relative to said slit-like illumination light beam; and
    a calculation circuit to integrate photo-electric signals from said plurality of light receiving elements, respectively.

11. An exposure apparatus according to claim 10, wherein said calculation circuit calculates an unevenness among integrated exposure values on said substrate relating to said direction across said scanning direction based on a plurality of integrated photo-electric signals.

12. An exposure apparatus according to claim 11, wherein said illumination light beam is in a form of pulses, and said calculation circuit calculates a minimum number of pulses to illuminate said substrate based on said unevenness among said integrated exposure values.

13. An exposure apparatus according to claim 6, wherein said illumination light beam is in a form of pulses, and said calculating device calculates a minimum number of pulses to illuminate said substrate based on said unevenness among said integrated values.

14. An exposure method according to claim 1, wherein said illumination light beam is in a form of pulses, and said sensor is moved in said scanning direction at a maximum speed for every said scanning operation during an emission of a minimum number of exposure pulses of said illumination light beam.

15. A method of measuring an illumination unevenness, comprising:

illuminating a slit-like illumination area with a pulse light beam, wherein said slit-like illumination area has a plurality of partial areas disposed along a direction substantially orthogonal to a scanning direction;

scanning a sensor in said scanning direction on a substrate stage relative to said slit-like illumination area to obtain a pulse energy of a plurality of pulse light beams; and obtaining an integrated value of said pulse energy for each of said partial areas.

16. A method according to claim 15, further comprising:

measuring said illumination unevenness relating to said direction substantially orthogonal to said scanning direction based on the integrated values of said pulse.

17. A scanning exposure method comprising the steps of:

providing pulsed beams used for an exposure operation in which said pulsed beams illuminate a mask having a pattern so as to form an image of said pattern on a substrate by moving said mask and said substrate synchronously in a scanning direction; and performing a scanning operation with a sensor in which said sensor is moved in said scanning direction and relative to said pulsed beams, during said scanning operation, and receives N pulsed beams, wherein N is an integer.

18. A method according to claim 17, wherein during said scanning operation, N is determined in accordance with an unevenness in energy at every pulsed beam.

19. A method according to claim 17, further comprising the step of obtaining information regarding unevenness in an integrated exposure value occurring in said exposure operation, in accordance with a result of said scanning operation with the sensor.

20. A method according to claim 17, wherein during said scanning operation, said sensor moves in an image plane of the pattern image of said mask or in a plane in the vicinity of said image plane.

21. A semiconductor device which is produced by using a scanning exposure method recited in claim 17.

22. A scanning exposure method in which a pattern of a mask is transferred onto a substrate while moving the mask and the substrate synchronously in a scanning direction relative to an exposure beam, the method comprising the steps of:

directing said exposure beam to an illumination area;

detecting an energy of said exposure beam in each of a plurality of positions along said scanning direction in said illumination area; and integrating the detected energies.

23. A scanning exposure method according to claim 22, wherein said pattern of said mask is transferred onto said substrate through a projection optical system and said illumination area is formed on an image plane side of said projection optical system.

24. A scanning exposure method according to claim 22, wherein said step of detecting an energy of said exposure beam is performed by moving a sensor relative to said illumination area along said scanning direction.

25. A scanning exposure method according to claim 24, wherein said sensor comprises a single receiving element.

26. A scanning exposure method according to claim 24, wherein said sensor is a line-sensor comprising a plurality of receiving elements arranged along said scanning direction.

27. A scanning exposure method according to claim 22, wherein a result of said integrating step is information on an integrated exposure value with respect to said substrate.

28. A scanning exposure method according to claim 22, further comprising:

performing said detecting step and said integrating step in a plurality of positions along a direction orthogonal to said scanning direction.

29. A scanning exposure method according to claim 28 wherein a result of said integrating step corresponding to said plurality of the positions along the direction orthogonal to said scanning direction is information on a distribution, in the direction orthogonal to said scanning direction, of integrated exposure values with respect to said substrate.

30. A scanning exposure method according to claim 22, wherein said illumination area is in a shape of a rectangular slit.

31. A scanning exposure method according to claim 22, wherein said exposure beam is a pulsed beam.

32. A scanning exposure method according to claim 22, wherein said exposure beam has a sectional intensity distribution on the illumination area in the scanning direction and the intensity distribution has a slope portion at an edge of the exposure beam.

33. A semiconductor device which is produced by using a scanning exposure method recited in claim 22.

34. A scanning exposure method in which a pattern of a mask is transferred onto a substrate while moving the mask and the substrate synchronously in a scanning direction relative to an exposure beam, the method comprising the steps of:

directing said exposure beam to an illumination area;

moving a sensor for detecting an energy of said exposure beam along said scanning direction relative to said illumination area; and integrating the energies detected in the movement of said sensor.

35. A scanning exposure method according to claim 34, wherein said pattern of said mask is transferred onto said substrate through a projection optical system, and said illumination area is formed on an image plane side of said projection optical system.

36. A scanning exposure method according to claim 34, wherein a result of said integrating step is information on an integrated exposure value with respect to said substrate.

37. A scanning exposure method according to claim 34, further comprising:

performing the detecting of the energy and said integrating step in a plurality of positions along a direction orthogonal to said scanning direction.

38. A scanning exposure method according to claim 37, wherein a result of said integrating step performed in said plurality of the positions along the direction orthogonal to said scanning direction is information on a distribution, in the direction orthogonal to said scanning direction, of integrated exposure values with respect to said substrate.

39. A scanning exposure method according to claim 34, wherein said illumination area is in a shape of a rectangular slit.

40. A scanning exposure method according to claim 34, wherein said exposure beam is a pulsed beam.

41. A scanning exposure method according to claim 40, wherein said sensor detects a predetermined number of pulsed beams while passing through said illumination area, and wherein said predetermined number is determined in accordance with a number of pulsed beams irradiating said substrate when said pattern of said mask is transferred onto said substrate.

42. A scanning exposure method according to claim 34, wherein a moving speed of said sensor is determined in accordance with a moving speed of said substrate when said pattern of said mask is transferred onto said substrate.

43. A scanning exposure method according to claim 34, wherein said sensor comprises a single receiving element.

44. A scanning exposure method according to claim 34, wherein said sensor is a line-sensor comprising a plurality of receiving elements arranged along a direction orthogonal to said scanning direction.

45. A scanning exposure method according to claim 34, wherein said exposure beam has a sectional intensity distribution on the illumination area in the scanning direction and the intensity distribution has a slope portion at an edge of the exposure beam.

46. A semiconductor device which is produced by using a scanning exposure method recited in claim 34.

47. A scanning exposure apparatus which transfers a pattern of a mask onto a substrate while moving the mask and the substrate synchronously in a scanning direction relative to an exposure beam, the apparatus comprising:
a beam source which emits said exposure beam;
a directing member, disposed between said beam source and said substrate, which directs said exposure beam to an illumination area;
a sensor, disposed on an exit side of said directing member, which detects an energy of said exposure beam in each of a plurality of positions along said scanning direction in said illumination area; and
a calculator, connected to said sensor, which integrates the detected energy.

48. A scanning exposure apparatus which transfers a pattern of a mask onto a substrate while moving the mask and the substrate synchronously in a scanning direction relative to an exposure beam, the apparatus comprising:
a beam source which emits said exposure beam;
a directing member, disposed between said beam source and said substrate, which directs said exposure beam to an illumination areas;
a sensor, disposed on an exit side of said directing member, which moves relative to said illumination area along said scanning direction to detect an energy of said exposure beam; and
a calculator, connected to said sensor, which integrates the detected energy during movement of said sensor.

49. A method of making a scanning exposure apparatus which transfers a pattern of a mask onto a substrate while moving the mask and the substrate synchronously in a scanning direction relative to an exposure beam, the method comprising the steps of:

providing a beam source which emits said exposure beam;
providing a directing member, disposed between said beam source and said substrate, which directs said exposure beam to an illumination area;
providing a sensor, disposed on an exit side of said directing member, which detects an energy of said exposure beam in each of a plurality of positions along said scanning direction in said illumination area; and
providing a calculator, connected to said sensor, which integrates the detected energy.

50. A method according to claim 49, wherein the detection of an energy of said exposure beam is performed by moving said sensor relative to said illumination area along said scanning direction.

51. A method according to claim 49, wherein said sensor comprises a single receiving element.

52. A method according to claim 49, wherein said sensor is a line-sensor comprising a plurality of receiving elements arranged along a direction orthogonal to said scanning direction.

53. A method according to claim 49 wherein a result of the integration is information on an integrated exposure value with respect to said substrate.

54. A method according to claim 49, wherein said exposure beam is an excimer pulsed beam.

55. A method of making a scanning exposure apparatus which transfers a pattern of a mask onto a substrate while moving the mask and the substrate synchronously in a scanning direction relative to an exposure beam, the method comprising the steps of:
providing a beam source which emits said exposure beam;
providing a directing member disposed between said beam source and said substrate, which directs said exposure beam to an illumination area;
providing a sensor, disposed on an exit side of said directing member, which moves relative to said illumination area along said scanning direction to detect an energy of said exposure beam; and
providing a calculator, connected to said sensor, which integrates the detected energy during movement of said sensor.

56. A method according to claim 55, wherein said sensor comprises a single receiving element.

57. A method according to claim 55, wherein said sensor is a line-sensor comprising a plurality of receiving elements arranged along a direction orthogonal to said scanning direction.

58. A method according to claim 55, wherein a result of the integration is information on an integrated exposure value with respect to said substrate.

59. A method according to claim 55, wherein said exposure beam is an excimer pulsed beam.

60. A method according to claim 55, wherein said sensor detects a predetermined number of pulsed beams while passing through said illumination area, and wherein said predetermined number is determined in accordance with a number of pulsed beams irradiating said substrate when said pattern of said mask is transferred onto said substrate.

61. A method according to claim 55, wherein a moving speed of said sensor is determined in accordance with a moving speed of said substrate when said pattern of said mask is transferred onto said substrate.

* * * * *